US008446179B2

(12) United States Patent
Maeda et al.

(10) Patent No.: US 8,446,179 B2
(45) Date of Patent: May 21, 2013

(54) START SIGNAL DETECTOR CIRCUIT

(75) Inventors: Tadashi Maeda, Tokyo (JP); Tomoyuki Yamase, Tokyo (JP)

(73) Assignee: NEC Corporation, Tokyo (JP)

( * ) Notice: Subject to any disclaimer, the term of this patent is extended or adjusted under 35 U.S.C. 154(b) by 1278 days.

(21) Appl. No.: 12/095,673

(22) PCT Filed: Nov. 29, 2006

(86) PCT No.: PCT/JP2006/323795
§ 371 (c)(1),
(2), (4) Date: May 30, 2008

(87) PCT Pub. No.: WO2007/063887
PCT Pub. Date: Jun. 7, 2007

(65) Prior Publication Data
US 2011/0121864 A1 May 26, 2011

(30) Foreign Application Priority Data

Dec. 2, 2005 (JP) ................................ 2005-348676
Jun. 27, 2006 (JP) ................................ 2006-176119

(51) Int. Cl.
*H03K 5/153* (2006.01)
(52) U.S. Cl.
USPC .......................................................... 327/72
(58) Field of Classification Search
USPC ....................................................... 327/175
See application file for complete search history.

(56) References Cited

U.S. PATENT DOCUMENTS
2006/0217099 A1   9/2006   Uda et al.

FOREIGN PATENT DOCUMENTS

| JP | 04-035304 A | | 2/1992 |
| JP | 7-44836 B2 | | 5/1995 |
| JP | 11-195972 A | | 7/1999 |
| JP | 2000-166244 A | | 6/2000 |
| JP | 2002-152080 A | | 5/2002 |
| JP | 2002-176141 | * | 6/2002 |
| JP | 2002-176141 A | | 6/2002 |
| JP | 2004-194301 A | | 7/2004 |
| JP | 2005-184175 A | | 7/2005 |
| WO | 85/01161 A1 | | 3/1985 |

OTHER PUBLICATIONS

John F. Dickson, "On-Chip High-Voltage Generation in MNOS Integrated Circuits Using an Improved Voltage Multiplier Technique"; IEEE Journal of Solid-State Circuits; vol. SC-11, No. 3; Jun. 1976; pp. 374-378.

* cited by examiner

*Primary Examiner* — Lincoln Donovan
*Assistant Examiner* — Daniel Rojas
(74) *Attorney, Agent, or Firm* — Sughrue Mion, PLLC

(57) ABSTRACT

A non-linear effect of a rectifier element is enhanced, an input amplitude is increased by further taking advantage of a resonance circuit, and a rectification efficiency of a rectifier circuit for detection is improved, so that the gain of an amplifier circuit at a latter stage can be set low. RF input terminals 101, 102 are applied with signals at phases opposite to each other. A signal at terminal 102 is applied to a gate of transistor M1 through capacitor C3, and a signal at terminal 101 is applied to node N1 connected with a source of transistor M1 and a gate and a drain of transistor M2 through capacitor C1. 301, 302 designate terminals applied with DC biases, and L1, C15 and L2, C16 are series resonance circuits. Half-wave double voltage rectifier circuits comprised of M1, M2, C1-C3, R1 are connected in cascade at a plurality of stages.

16 Claims, 13 Drawing Sheets $V_d = 0.35V$

|  | $R_1 / R_2$ | $I_2 - I_1$ |
|---|---|---|
| 1mV | 1.035 | $3 \times 10^{-9}$ |
| 10mV | 1.431 | $3.7 \times 10^{-8}$ |
| 100mV | 37.5 | $3.7 \times 10^{-6}$ |

START SIGNAL DETECTOR CIRCUIT

TECHNICAL FIELD

The present invention relates to a start signal detector circuit, and more particularly, to a circuit which receives radio frequency signal power (RF) at a particular frequency to generate a DC potential (DC) required to intermittently operate an electronic system.

BACKGROUND ART

In recent years, DSRC (Dedicated Short Range Communication), which has been studied for development, is a communication system directed to narrow ranges for use in communications between cars on roads such as ETC (Electronic Toll Collection System), a commercial car management system and the like. The DSRC is classified into a light-based system and a radiowave-based system, and is generally deemed to be available for communications in a range of several meters to several hundred meters. The specifications of this system are established by ARIB STD (Association of Radio Industries Businesses standard)—T55 Standard and STD-T75 Standard, and employs a carrier frequency in a range of 5772.5 to 5847.5 MHz for a radio communication system.

A SMART PLATE (System of Multifunctional integration of Automobiles and Roads in Transport in 21st Century PLATE) system which has been progressively developed as part of this DSRC involves an IC chip on a current number plate which records information on the number plate and information described in a car registration file, and is now under investigation as an infrastructure related to individual car information indispensable for popularizing ITS (Intelligent Transport Systems), or as a means for identifying cars in car traffic administration.

This system is targeted to be capable of operating for five years without replacing a built-in battery by detecting a start signal to intermittently operate the system. A weak signal of −60 dBm in a 5.8 GHz band is used for the start signal, and a circuit is required to stably detect such a signal.

A diode-based detector circuit is known for detection of radio frequency signals, and FIG. 1A shows a representative circuit example thereof. 101 designates an RF input terminal; 201 designates an output terminal; 401 designates a power terminal; D1, D2 designate diodes; C21, C22 designate capacitors; and R21 designates a resistor. In this circuit, during half period A of an input RF signal shown in FIG. 1B, a current flows into input terminal 101 through diode D1, and capacitor C21 is charged. In the next half period B, no current flows because diode D1 is biased in the opposite direction. In this half period, a current flows from capacitor C21 through diode D2 to charge capacitor C22. Finally, the potential on capacitor C22 increases by a charge charged in each half period. This circuit performs rectification by taking advantage of a non-linear effect of the diodes to charge each capacitor only for one-half period, so that this rectifier circuit is called a "half-wave double voltage rectifier circuit."

A start signal output circuit using such a half-wave double voltage rectifier circuit has been proposed (for example, see Patent Document 1 [JP-2004-194301-A]). FIG. 2 is a circuit diagram of the start signal output circuit which is disclosed in Patent Document 1. This circuit generally comprises detector/amplifier circuit 510, determination circuit 520 for amplifying and binarizing a detected start signal, and binarization circuit 530, and detects and amplifies an RF signal applied from RF input terminal 101 to generate a determination output from output terminal 201.

In detector/amplifier circuit 510, a half-wave double voltage rectifier circuit comprises capacitor C31 which additionally operates for input matching; smoothing capacitor C32; and diode-connected transistors Q3, Q4, where capacitors C31, C32 and transistors Q3, Q4 correspond to capacitors C21, C22 and diodes D2, D1 in FIG. 1A. Transistors Q7, Q8 comprises a current mirror circuit, where a current of reference transistor Q7 in the current mirror circuit is determined by the resistance value of resistor R31 which is a load resistance. A differential amplifier circuit is comprised of bipolar transistors Q1, Q2 which are loaded with a MOS transistor, and its total current is made constant by the current mirror circuit. While diode-connected transistors Q5, Q6 and capacitor C33 are connected to transistor Q2 as well, symmetrically to those of transistor Q1, the signal from RF input terminal 101 is not applied to this side. Therefore, transistor Q2 is applied with a constant bias at all times as a reference signal. A base current of transistor Q1 of the differential amplifier is supplied from transistor Q3 of the half-wave double voltage rectifier circuit, and the output of the differential amplifier is supplied to determination circuit 520.

In detector/amplifier circuit 510, when no RF signal is applied, the half-wave double voltage rectifier circuit comprised of transistors Q3, Q4 and capacitors C31, C32 is identical in configuration to a bias circuit comprised of transistors Q5, Q6 and capacitor C33 for applying the reference potential of the differential amplifier. Therefore, in the case where in-plane variations of elements within a chip can be neglected, two input terminals of the differential amplifier can be applied with the same potential at all times even if the element characteristics generally fluctuate due to fluctuations in processes or even if an ambient temperature varies. Accordingly, this circuit can correctly detect even a very small signal amplitude.

In addition, a rectifier circuit having diodes connected in series at multiple stages is also known (see, for example, Non-Patent Document 1 [John F. Dickson, "On-chip high-voltage generation in MNOS integrated circuits using an improved voltage multiplier technique," IEEE Journal of Solid-State Circuits, vol. SC-11, No. 3, pp. 374-378, 1976]). FIG. 3 is a circuit diagram of the multi-stage connected rectifier circuit proposed in Non-Patent Document 1 (although the shown example is a six-stage connected circuit, the actual number of stages is larger than this). In FIG. 3, 103, 104 designate clock input terminals which are applied with clocks at opposite phases to each other; 205 designates an output terminal; 311 designates a DC bias terminal; D designates a diode; and C designates a capacitor. According to this circuit, a voltage increase is provided for each stage of the diode, the voltage increase being obtained by subtracting a ripple voltage due to charging and discharging of the capacitor associated with an output current and a forward voltage of the diode from an amplitude based on a clock at a diode node. In the circuit shown in FIG. 3, the diode can be replaced with a diode-connected MOS transistor. In this event, the diode forward voltage used in calculating the aforementioned voltage increase is replaced with the threshold voltage of the MOS transistor.

DISCLOSURE OF THE INVENTION

As described above, an RF signal can be converted to a DC level when the non-linear effect of the diode is utilized, but if the received power is −60 dBm, a signal amplitude of only approximately 300 µV can merely be generated at a peak assuming that the input impedance of an antenna is 50Ω. FIG. 4 shows the result of a simulation as to which characteristics are exhibited by non-linear resistance of the diode in response to the application of such an infinitesimal amplitude. FIG. 4A is an IV characteristic of the diode, where the horizontal axis represents bias potential Vd, and the vertical axis represents a current in logarithm. The IV characteristic of the diode is linear when it is represented by an exponential function as shown in the figure. The figure further shows a definition equation for calculating the resistance. For example, assuming that the diode is biased to potential Vd, and a diode current at that time is Id (Vd), resistance R1 is given by Vd/Id(Vd). Next, assuming that this diode is applied with an RF signal to cause the bias potential to increase by ΔV and the current to change to Id(Vd+ΔV), resistance R2 is (Vd+ΔV)/Id(Vd+ΔV) at that point.

In the calculation, an ideal silicon pn-junction diode was assumed, and the DC bias potential was set to be 0.35 V. Then, resistance ratio R1/R2 and current difference I2-I1 are shown in FIG. 4B when a change ΔV in the bias potential is set to 1 mV, 10 mV, 100 mV. It is understood from this result that the resistance values hardly change in response to a potential difference of 1 mV, and even an ideal diode behaves similarly to a linear resistor with an input signal of 1 mV. Accordingly, when the input amplitude is equal to or smaller than 1 mV, it is anticipated that a diode-based rectifier circuit will significantly exacerbate the rectification efficiency. On the other hand, when the amplitude is 100 mV, it can be anticipated that a sufficient rectification efficiency can be provided because the resistance ratio is approximately 40 times.

As a result of calculating, using a microwave simulator, an input power dependence of an output DC level of a half-wave double voltage rectifier circuit, when using an ideal diode, with a DC bias value of the diode as a parameter, it was revealed that merely approximately 8 µV can be detected with an input of −60 dBm, i.e., an input amplitude of approximately 300 µV in a 5.8 GHz band. For amplifying such an infinitesimal voltage to approximately 1 V which can be utilized as a start signal, an amplifier having a gain of approximately 100 dB is required at a later stage, resulting in a concern that an excessively high gain will cause the circuit to oscillate.

On the other hand, even in the circuit having the multi-stage connection configuration shown in FIG. 3, the number of stages to be connected must be increased when a signal having an infinitesimal amplitude is amplified, resulting in a significant increase in input capacitance. When the input capacitance is large and a desired frequency band is in a radio frequency region, since the input impedance remarkably reduces, an input amplitude is reduced as a result. By using a microwave simulator, FIG. 5 shows the result of calculating the characteristics of a circuit which comprises diode-connected n-type MOS (Metal Oxide Semiconductor) transistors connected in series at 100 stages, each having a threshold voltage equal to 0 V and a gate length equal to 0.18 µm, as an element having a non-linear resistance. A bias of a rectifier circuit was chosen to be 1 V in this event. The horizontal axis represents input RF power, while the vertical axis represents an output potential of the rectifier circuit. Even with MOS transistors connected at 100 stages, a resulting DC voltage is approximately 150 µV at most when the RF input power in the 5.8 GHz band is −60 dBm. Therefore, a gain of approximately 80 dB is required at a later stage in order to provide an output of approximately 1 V. In other words, even when the multi-stage connected circuit shown in FIG. 3 is used, the number of connection stages of diodes (MOS transistors) must be largely increased, and even though the number of connection stages is increased, an amplifier having a high amplification rate is still required at a later stage.

A challenge of the present invention is to solve the problems of the related art described above, and it is an object of the invention to provide the ability to increase the rectification efficiency of a rectifier circuit for detection, set a low gain to an amplifier circuit at a later stage, and consequently stably detect a start signal.

To achieve the above object, according to the present invention, there is provided a start signal detector circuit comprising a three-terminal element including a first and a second terminal and a control terminal, a resistance value of which changes non-linearly in response to a control voltage or a control current applied to the control terminal, the start signal detector circuit being characterized in that a bias potential is applied to the first terminal and the control terminal of the three-terminal element, and an input signal is applied to the second terminal.

Also, to achieve the above object, according to the present invention, there is provided a start signal detector circuit comprising a three-terminal element including a first and a second terminal and a control terminal, a resistance value of which changes non-linearly in response to a control voltage or a control current applied to the control terminal, the start signal detector circuit being characterized in that a bias potential is applied to the first terminal of the three-terminal element, an input signal is applied to the second terminal, and a signal at a phase opposite to the input signal is applied to the control terminal.

Also, to achieve the above object, according to the present invention, there is provided a start signal detector circuit comprising unit detector circuits, each including a first and a second three-terminal element, each element of the first and second three-terminal elements including a first and a second terminal and a control terminal, a resistance value of which changes non-linearly in response to a control voltage or a control current applied to the control terminal, the second terminal of the first three-terminal element being connected to the first terminal of the second three-terminal element, the unit detector circuits being connected in cascade at a plurality of stages in a manner in which the second terminal of the second three-terminal element at a previous stage is connected to the first terminal of the first three-terminal element at the next stage, the start signal detector circuit being characterized in that an input signal is applied to the second terminal of the first three-terminal element and to the control terminal of the second three-terminal element, a bias potential is applied to the first terminal and the control terminal of the first three-terminal element of the unit detector circuit at a first stage, and the second terminal of the second three-terminal element of the unit detector circuit at a final stage is employed as an output terminal.

Also, to achieve the above object, according to the present invention, there is provided a start signal detector circuit comprising unit detector circuits, each including a first and a second three-terminal element, each element of the first and second three-terminal elements including a first and a second terminal and a control terminal, a resistance value of which changes non-linearly in response to a control voltage or a control current applied to the control terminal, the second terminal of the first three-terminal element being connected to the first terminal of the second three-terminal element, the unit detector circuits being connected in cascade at a plurality of stages in a manner in which the second terminal of the second three-terminal element at a previous stage is connected to the first terminal of the first three-terminal element at the next stage, the start signal detector circuit being characterized in that an input signal is applied to the second terminal of the first three-terminal element and to the control terminal of the second three-terminal element, a signal at a phase opposite to the input signal is applied to the control terminal of the first three-terminal element, a bias potential is applied to the first terminal of the first three-terminal element of the unit detector circuit at a first stage, and the second terminal of the second three-terminal element of the unit detector circuit at a final stage is employed as an output terminal.

Also, to achieve the above object, according to the present invention, there is provided a start signal detector circuit comprising unit detector circuits, each including a first and a second three-terminal element, each element of the first and second three-terminal elements including a first and a second terminal and a control terminal, a resistance value of which changes non-linearly in response to a control voltage or a control current applied to the control terminal, the second terminal of the first three-terminal element being connected to the first terminal of the second three-terminal element, the unit detector circuits being connected in cascade at a plurality of stages in a manner in which the second terminal of the second three-terminal element at a previous stage is connected to the first terminal of the first three-terminal element at the next stage, the start signal detector circuit being characterized in that an input signal is applied to the second terminal of the first three-terminal element and the control terminal of the second three-terminal element, a bias potential is applied to the control terminal of the first three-terminal element and to the first terminal of the first three-terminal element of the unit detector circuit at a first stage, and the second terminal of the second three-terminal element of the unit detector circuit at a final stage is employed as an output terminal.

Also, to achieve the above object, according to the present invention, there is provided a start signal detector circuit comprising unit detector circuits, each including a first and a second three-terminal element, each element of the first and second three-terminal elements including a first and a second terminal and a control terminal, a resistance value of which changes non-linearly in response to a control voltage or a control current applied to the control terminal, the second terminal of the first three-terminal element being connected to the first terminal of the second three-terminal element, the unit detector circuits being connected in cascade at a plurality of stages in a manner in which the second terminal of the second three-terminal element at a previous stage is connected to the first terminal of the first three-terminal element at the next stage, the start signal detector circuit being characterized in that an input signal is applied to the second terminal of the first three-terminal element and to the control terminal of the second three-terminal element, a signal at a phase opposite to the input signal is applied to the control terminal of the first three-terminal element, a bias potential is applied to the first terminal of the first three-terminal element of the unit detector circuit at a first stage, and the second terminal of the second three-terminal element of the unit detector circuit at a final stage is employed as an output terminal.

Also, to achieve the above object, according to the present invention, there is provided a start signal detector circuit comprising a first start signal detector which comprises first unit detector circuits and a second start signal detector which comprises second unit detector circuits, each unit detector circuit of the first and unit detector circuits including a first and a second three-terminal element, each element of the first and second three-terminal elements including a first and a second terminal and a control terminal, a resistance value of which changes non-linearly in response to a control voltage or a control current applied to the control terminal, the second terminal of the first three-terminal element being connected to the first terminal of the second three-terminal element, each unit detector circuit of the first and second unit detector circuits being connected in cascade at a plurality of stages in a manner in which the second terminal of the second three-terminal element at a previous stage is connected to the first terminal of the first three-terminal element at the next stage, the start signal detector circuit being characterized in that:

in the first start signal detector, an input signal is applied to the second terminal of the first three-terminal element and to the control terminal of the second three-terminal element, a signal at a phase opposite to the input signal is applied to the control terminal of the first three-terminal element, a bias potential is applied to the first terminal of the first three-terminal element of the first unit detector circuit at the first stage, and the second terminal of the second three-terminal element of the first unit detector circuit at the final stage is employed as an output terminal of the first start signal detector;

in the second start signal detector, an input signal is applied to the control terminal of the first three-terminal element, a signal at a phase opposite to the input signal is applied to the second terminal of the first three-terminal element and to the control terminal of the second three-terminal element, a bias potential is applied to the first terminal of the first three-terminal element of the second unit detector circuit at the first stage, and the second terminal of the second three-terminal element of the second unit detector circuit at the final stage is employed as an output terminal of the second start signal detector; and a difference between an output signal of the first start signal detector and an output signal of the second start signal detector is defined as an output signal.

According to the start signal detector circuit of the present invention, input signals at phases opposite to each other are applied to a control terminal and a second terminal of a non-linear three-terminal element, specifically, a gate and a source of a MOSFET (or a base and an emitter of a bipolar transistor). In this way, the non-linearity of the non-linear three-terminal element can be effectively utilized even if the power of an input signal is small, making it possible to improve the rectification efficiency of a rectifier circuit for detection and to stably detect a start signal without malfunction even with a weak signal of −60 dBm. Thus, according to the present invention, the power consumption of the smart plate system, whose realization in future is desirable, can be reduced.

Figure 1A:
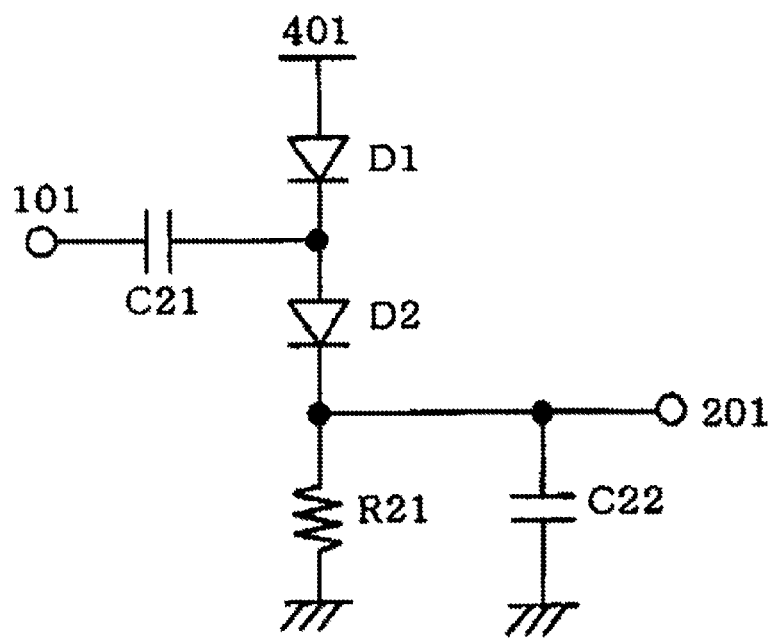
FIG. 1A is a circuit diagram showing a conventional rectifier circuit.
Figure 1B:
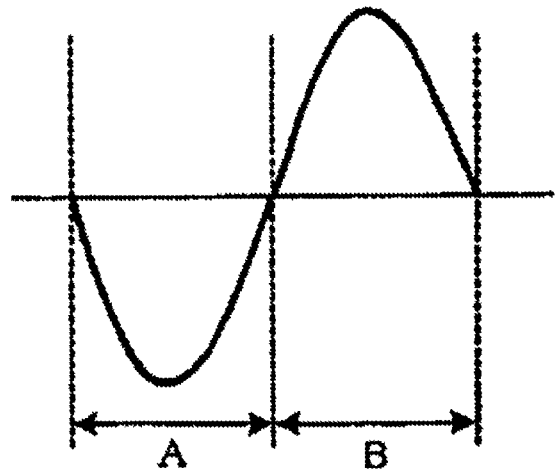
FIG. 1B is a waveform chart for describing the operation principle of the rectifier circuit shown in FIG. 1A.
Figure 2:
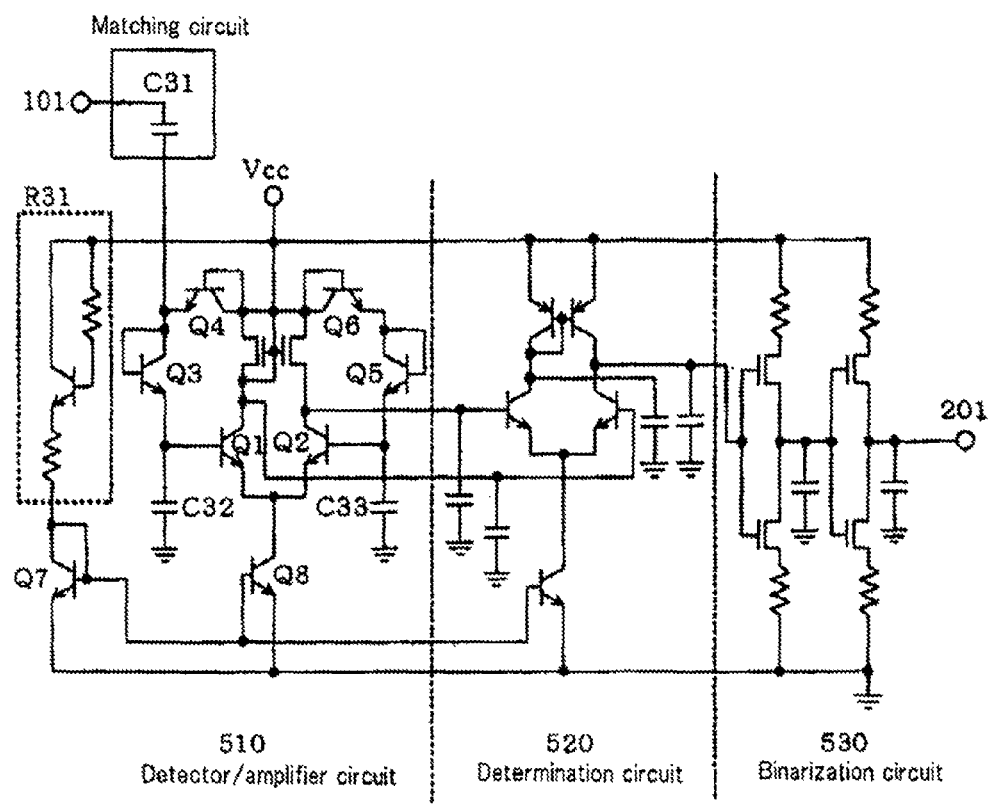
FIG. 2 is a circuit diagram showing another example of a conventional rectifier circuit.
Figure 3:
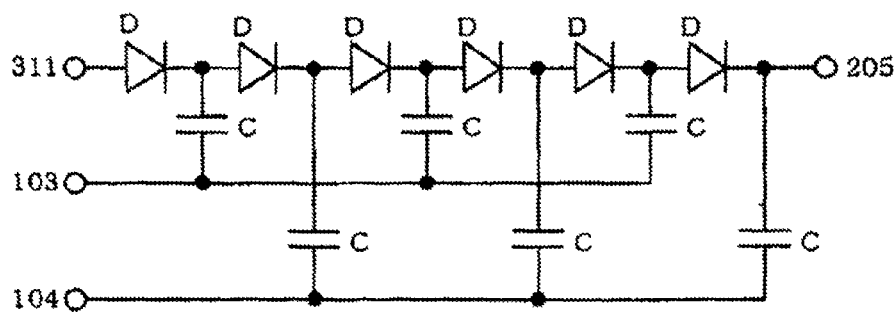
FIG. 3 is a circuit diagram showing a further example of a conventional rectifier circuit.
Figures 4A, 4B:
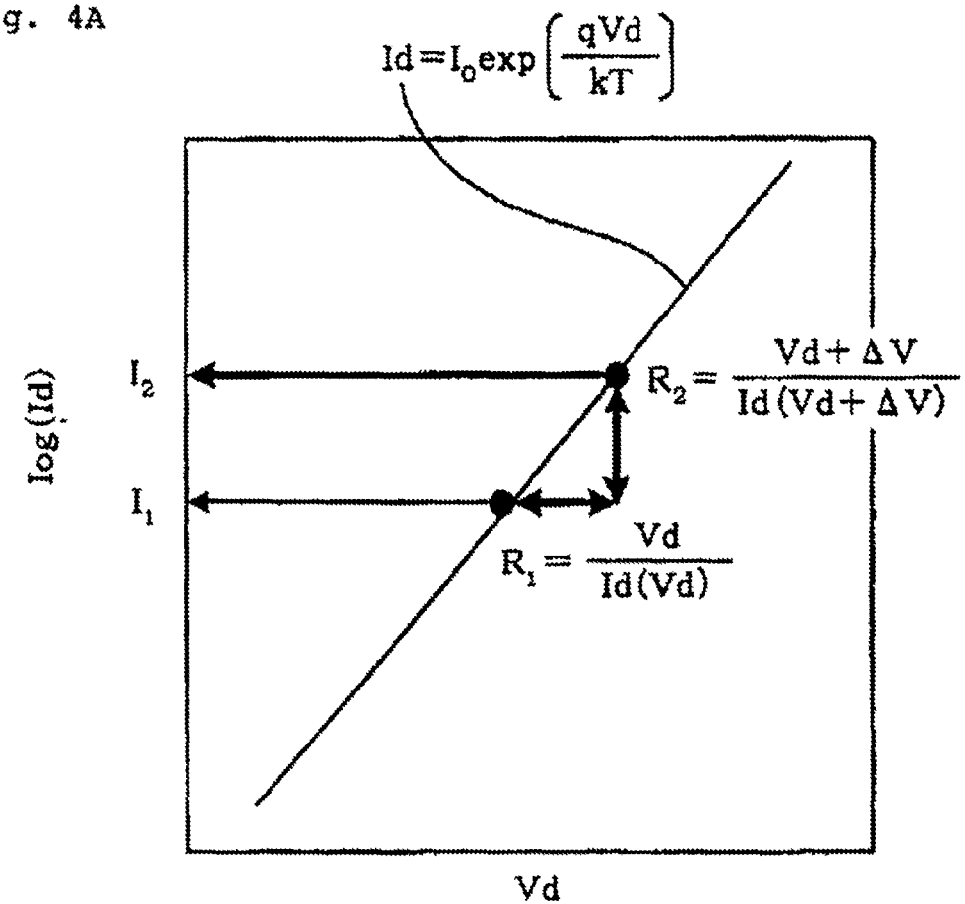
FIG. 4A is a VI characteristic diagram of a diode for describing a subject of a conventional example.
FIG. 4B is a diagram showing a change in the resistance ratio and current difference when a bias potential is changed.
Figure 5:
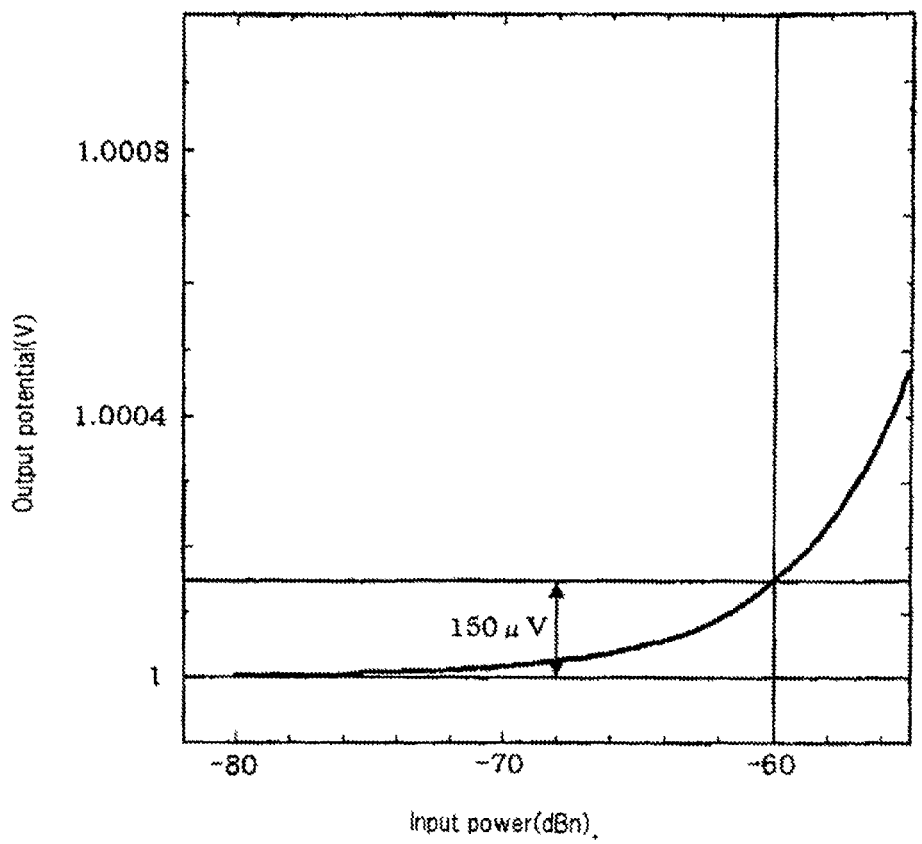
FIG. 5 is a graph showing the characteristic of the conventional example shown in FIG. 3.

DESCRIPTION OF REFERENCE NUMERALS 101, 102 RF Input Terminals
103, 104 Clock Input Terminals
201-206 Output Terminals
301-309 DC Bias Terminals
N1-N6 Nodes

BEST MODE FOR CARRYING OUT THE INVENTION

In the following, the present invention will be described with reference to specific exemplary embodiments. In the following, the same items are designated the same reference numerals, and repeated descriptions are omitted.

First Exemplary Embodiment

Figure 6:
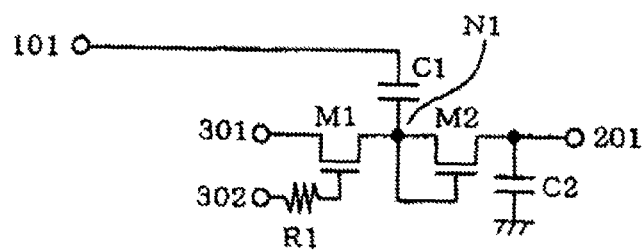
FIG. 6 is a circuit diagram of a first embodiment of the present invention.

FIG. 6 is a circuit diagram of a start signal detector circuit of a first exemplary embodiment of the present invention, In FIG. 6, 101 designates an RF input terminal; 201 designates an output terminal; 301, 302 designate DC bias terminals; M1, M2 designate MOS transistors; C1, C2 designate capacitors; and R1 designates a resistor. MOS transistor M1 has a drain terminal connected to DC bias terminal 301, and a source terminal connected to RF input terminal 101 through capacitor C1. A DC potential at a gate terminal is supplied from DC bias terminal 302 through resistor R1. Also, MOS transistor M2 has a drain terminal and a gate terminal commonly connected to node N1 and applied with RF signal through capacitor C1. MOS transistor M2 has a source connected to output terminal 201. Also, capacitor C2 for signal charge accumulation is connected to the source of MOS transistor M2.

In this circuit, a current flows into capacitor C1 from bias terminal 301 through MOS transistor M1 during a half period in which the potential at input terminal 101 becomes low, so that the potential at node N1 is increased by the rectified voltage of the RF signal from the DC bias potential applied to bias terminal 301. In this event, a gate-source voltage of MOS transistor M1 can be set to a current value which results in the highest rectification efficiency by bias terminal 302. In the next half period, since the drain-source voltage of MOS transistor M1 is reversely biased, no drain current flows into MOS transistor M1. In this event, capacitor C2 is charged by a current which flows from capacitor C1 through MOS transistor M2. Finally, the potential of capacitor C2 is increased by the sum of charges charged in the respective halve periods. Since this configuration can significantly enhance the nonlinearity of the MOS transistor even if the input amplitude is small, the rectification efficiency can be improved as a result.

Second Exemplary Embodiment

Figure 7:
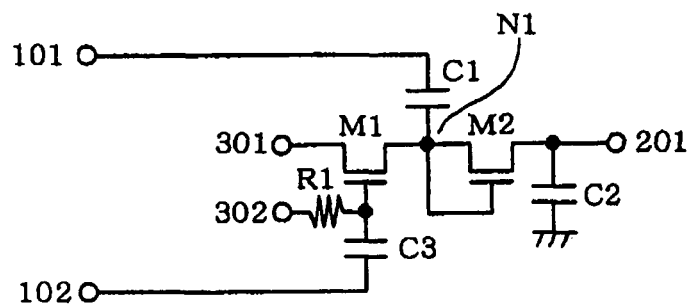
FIG. 7 is a circuit diagram of a second embodiment of the present invention.

FIG. 7 is a circuit diagram of a start signal detector circuit of a second exemplary embodiment of the present invention. In FIG. 7, 101 designates an RF input terminal; 102 designates an RF input terminal which is applied with an RF signal at a phase opposite to 101; 201 designates an output terminal; 301, 302 designate DC bias terminals; M1, M2 designate MOS transistors; C1-C3 designate capacitors; and R1 designates a resistor. MOS transistor M1 has a drain terminal connected to DC bias terminal 301, and a source terminal and a gate terminal connected to RF input terminals 101, 102, respectively, through capacitor C1, C3. Therefore, the source terminal and gate terminal are applied with RF signals at phases opposite to each other. Also, MOS transistor M2 has a drain terminal and a gate terminal commonly connected to node N1 and applied with an RF signal through capacitor C1. MOS transistor M2 has a source connected to output terminal 201, and capacitor C2 for signal charge accumulation is connected to the source of MOS transistor M2. Capacitor C3 is intended to block the DC bias of the RF signal, and a DC potential at the gate is supplied from DC bias terminal 302 through resistor R1.

In this circuit, a current flows into capacitor C1 from bias terminal 301 through MOS transistor M1 during a half period in which the potential at input terminal 101 is low, so that the potential at node N1 is increased by a rectified voltage of the RE signal from the DC bias potential applied to bias terminal 301. In this event, since a gate-source voltage of MOS transistor M1 is equivalently applied with an amplitude twice as large as the RF signal, the drain current increases, resulting in an increase in a change in potential. In the next half period, since the drain-source voltage of MOS transistor M1 is reversely biased, no drain current flows into MOS transistor M1. In this event, capacitor C2 is charged by a current which flows from capacitor C1 through MOS transistor M2. Finally, the potential of capacitor C2 is increased by the sum of charges charged in the respective halve periods. Since this configuration can significantly enhance the non-linearity of the MOS transistor even if the input amplitude is small, the rectification efficiency can be improved as a result.

Third Exemplary Embodiment

Figure 8:
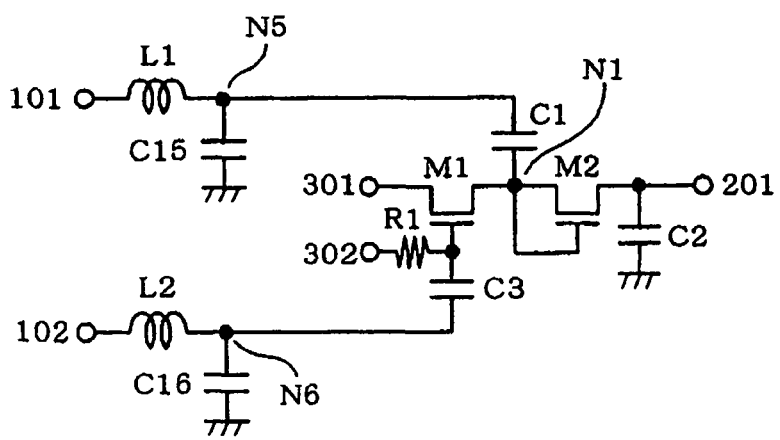
FIG. 8 is a circuit diagram of a third embodiment of the present invention.

FIG. 8 is a circuit diagram of a start signal detector circuit of a third exemplary embodiment of the present invention. The circuit of this embodiment comprises series resonance circuits which are added to RF input terminals 101, 102 in the start signal detector circuit of the second exemplary embodiment shown in FIG. 7. Specifically, inductor L1 and capacitor C15 connected to RF input terminal 101 are designed to resonate in series in a desired frequency band, and likewise, inductor L2 and capacitor C16 connected to RF input terminal 102 are designed to resonate in series in a desired frequency band. In this circuit, an impedance viewed from RF input terminals 101, 102 toward the inductor is minimized in the desired frequency band, whereas impedance viewed from nodes N5, N6 toward the inductor is maximized, and the amplitudes of signals at nodes N5, N6 are increased by the resonance, so that the non-linearity of MOS transistor M1 can be further increased. As a result, the rectification efficiency can be more improved.

Fourth Exemplary Embodiment

Figure 9:
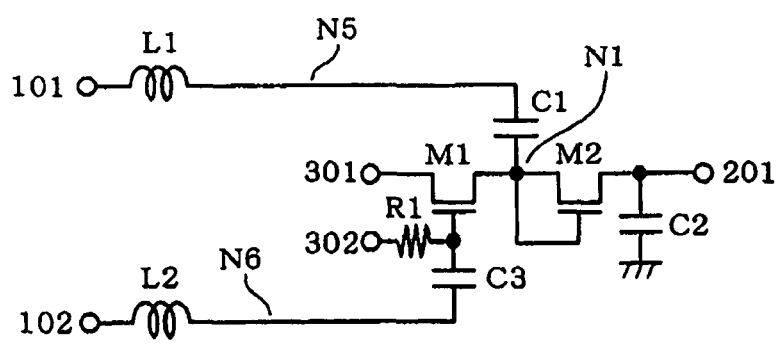
FIG. 9 is a circuit diagram of a fourth embodiment of the present invention.

FIG. 9 is a circuit diagram of a start signal detector circuit of a fourth exemplary embodiment of the present invention. The embodiment is a circuit in which an inductor for a resonance circuit is added to the second embodiment shown in FIG. 7, and is the same as the remaining configuration in the second exemplary embodiment. In the circuit of the embodiment, the series resonance circuits are comprised only of inductor L1 and the input capacitance of node N1, and inductor L2 and a gate input capacitance of MOS transistor M1, respectively. The circuit of this embodiment is employed when a desired frequency band is so high that capacitors C15 and C16 are not needed.

Fifth Exemplary Embodiment

Figure 10:
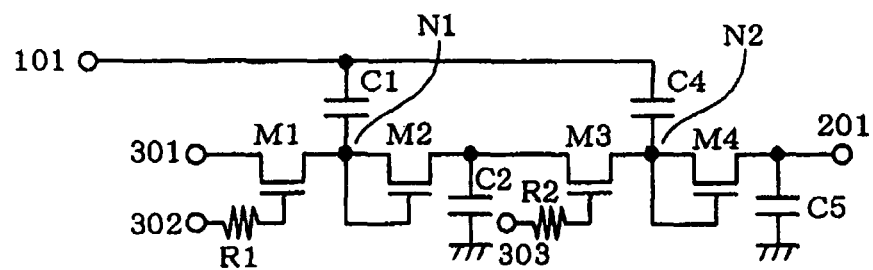
FIG. 10 is a circuit diagram of a fifth embodiment of the present invention.

FIG. 10 is a circuit diagram of a start signal detector circuit of a fifth exemplary embodiment of the present invention. A rectifier circuit of this embodiment comprises half-wave double voltage rectifier circuits which are connected in cascade at two stages. In FIG. 10, 101 designates an RF input terminal; 201 designates an output terminal, 301-303 designate DC bias terminals; M1-M4 designate MOS transistors; C1, C2, C4, C5 designate capacitors; and R1, R2 designate resistors. In this circuit, MOS transistors M1, M2, capacitors C1, C2, and resistor R1 comprise a half-wave double voltage rectifier circuit at the former stage, and this part is similar in configuration and operation to that of the first embodiment shown in FIG. 6, so that a detailed description is omitted.

MOS transistors M3, M4, capacitors C4, C5, and resistor R2 comprise a half-wave double voltage rectifier circuit at the latter half, where MOS transistor M3 has a drain terminal and a source terminal, the drain terminal being connected to a source terminal of MOS transistor M2 which is an output terminal of the half-wave double voltage rectifier circuit at the former half, the source terminal of MOS transistor M3 being connected to RF input terminal 101 through capacitor C4. A DC potential at a gate of MOS transistor M3 is supplied from DC bias terminal 303 through resistor R2. Also, MOS transistor M4 has a drain terminal and a gate terminal commonly connected to node N2 and applied with an RF signal through capacitor C4. MOS transistor M4 has a source connected to output terminal 201, and capacitor C5 for signal charge accumulation is connected to the source of MOS transistor M4.

In this half-wave double voltage rectifier circuit at the latter stage, a current flows into capacitor C4 from the output terminal of the half-wave double voltage rectifier circuit at the former stage through MOS transistor M3 during a half period in which the potential at RF input terminal 101 is low, so that the potential at node N2 is increased by a rectified voltage of the RF signal from the output voltage of the half-wave double voltage rectifier circuit at the former stage. More specifically, the potential at node N2 is increased by a double rectified voltage of the RF signal from the potential at node N1. In this event, a gate-source voltage of MOS transistor M1 can be set to a current value which results in the highest rectification efficiency by bias terminal 302. In the next half period, since the drain-source of MOS transistor M3 is reversely biased, no drain current flows into MOS transistor M3. In this event, capacitor C5 is charged by a current which flows from capacitor C4 through MOS transistor M4. Finally, the potential at output terminal 201 is increased by two stages of half-wave double voltage rectifier circuits from DC bias terminal 301.

Sixth Exemplary Embodiment

Figure 11:
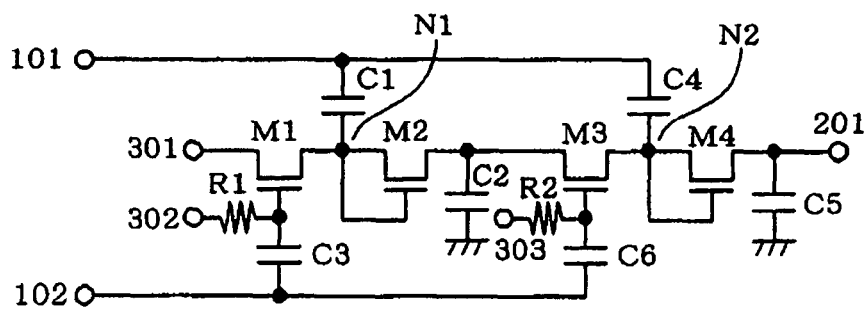
FIG. 11 is a circuit diagram of a sixth embodiment of the present invention.

FIG. 11 is a circuit diagram of a start signal detector circuit of a sixth exemplary embodiment of the present invention. A rectifier circuit of this embodiment comprises half-wave double voltage rectifier circuits which are connected in cascade at two stages. In FIG. 11, 101, 102 designate RF input terminals; 201 designates an output terminal; 301-303 designate DC bias terminals; M1-M4 designate MOS transistors; C1-C6 designate capacitors; and R1, R2 designate resistors. In this circuit, MOS transistors M1, M2, capacitors C1-C3, and resistor R1 comprise a half-wave double voltage rectifier circuit at the former stage, and this part is similar in configuration and operation to that of the second embodiment shown in FIG. 7, so that a detailed description is omitted.

MOS transistors M3, M4, capacitors C4-C6, and resistor R2 comprise a half-wave double voltage rectifier circuit at the latter half, where MOS transistor M3 has a drain terminal connected to a source terminal of MOS transistor M2 which is an output terminal of the half-wave double voltage rectifier circuit at the former half, and a source terminal and a gate terminal connected to RF input terminals 101, 102, respectively, through capacitor C4, C6. Therefore, the source terminal and gate terminal of MOS transistor M3 are applied with RF signals at phases opposite to each other. Also, MOS transistor M4 has a drain terminal and a gate terminal commonly connected to node N2 and applied with RF signal through capacitor C4. MOS transistor M4 has a source connected to output terminal 201, and capacitor C5 for signal charge accumulation is connected to the source of MOS transistor M4. Capacitor C6 is intended to block a DC bias of the RF signal, and a DC potential at the gate of MOS transistor M3 is supplied from DC bias terminal 303 through resistor R2.

In this half-wave double voltage rectifier circuit at the latter stage, a current flows into capacitor C4 from the output terminal of the half-wave double voltage rectifier circuit at the former stage through MOS transistor M3 during the half period in which the potential at input terminal 101 is low, so that the potential at node N2 is increased by a rectified voltage of the RF signal from an output voltage of the half-wave double voltage rectifier circuit at the former stage. More specifically, the potential at node N2 is increased by a double rectified voltage of the RF signal from the potential at node N1. In this event, since a gate-source voltage of MOS transistor M3 is equivalently applied with an amplitude twice as large as the RF signal, the drain current increases, resulting in an increase in a change in potential. In the next half period, since the drain-source voltage of MOS transistor M3 is reversely biased, no drain current flows into MOS transistor M3. In this event, capacitor C5 is charged by a current which flows from capacitor C4 through MOS transistor M4. Finally, the potential at output terminal 201 is increased by the two stages of the half-wave double voltage rectifier circuits from DC bias terminal 301.

Figure 12:
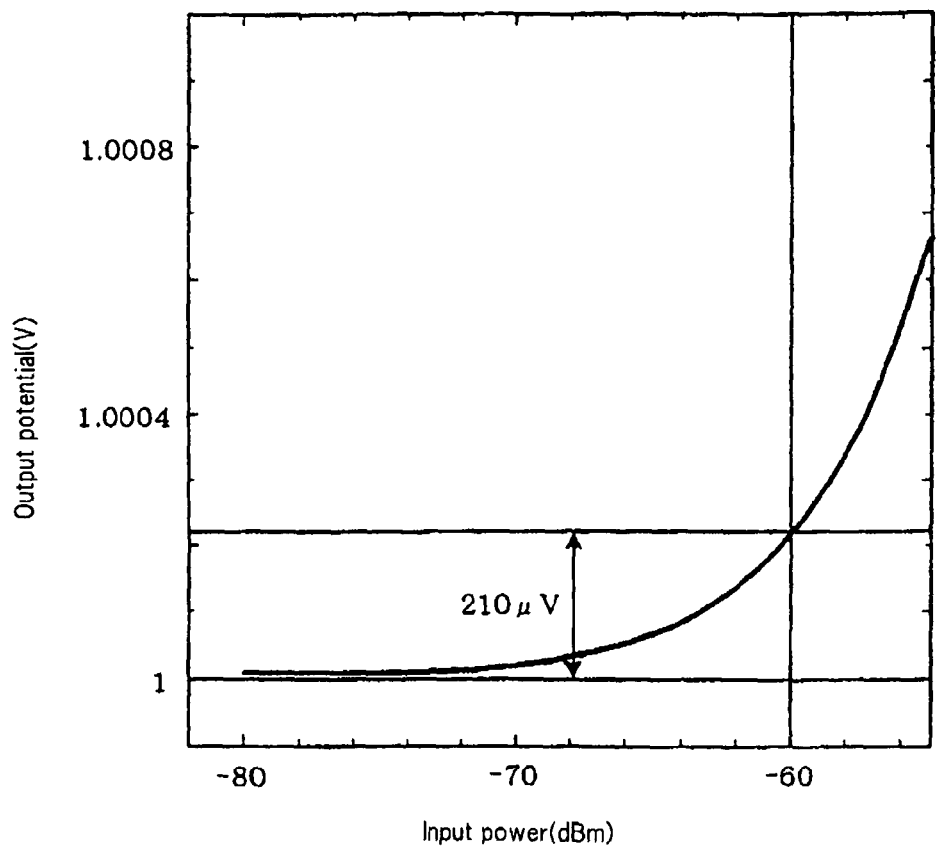
FIG. 12 is a graph showing the result of a characteristic simulation for the sixth embodiment of the present invention.

FIG. 12 is a graph, that by using a microwave simulator, shows the results of calculating the characteristics of a circuit comprising half-wave double voltage rectifier circuits that are connected in cascade at 20 stages by using n-type MOS transistors each having a threshold voltage of 0 V and a gate of 0.18 μm, when an RF signal in a 5.8 GHz band is applied thereto, as a specific example of the sixth exemplary embodiment of the present invention. In this event, the bias for the rectifier circuit was chosen to be 1 V. The horizontal axis represents input RF power, while the vertical axis represents an output potential of the rectifier circuit. By applying complementary RF signals to inputs of the respective rectifier circuits to improve the non-linear effect, rectification efficiency can be improved, and an amplitude of 210 μV, which is approximately 1.5 times as large can be generated as compared with the conventional case where MOS transistors were connected at 100 stages.

Seventh Exemplary Embodiment

Figure 13:
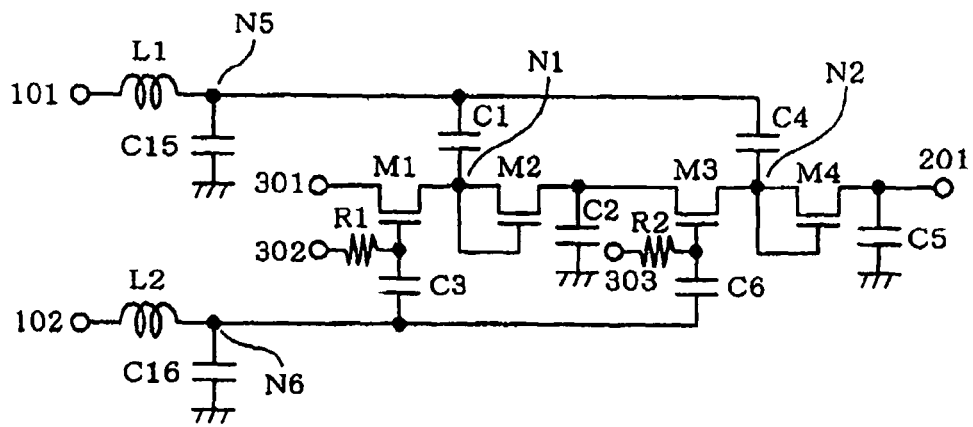
FIG. 13 is a circuit diagram of a seventh embodiment of the present invention.

FIG. 13 is a circuit diagram of a start signal detector circuit of a seventh exemplary embodiment of the present invention. A rectifier circuit of this embodiment comprises half-wave double voltage rectifier circuits connected in cascade at two stages, and the half-wave double voltage rectifier circuit/two-stage cascade connected portion is similar in configuration and operation to that of the sixth exemplary embodiment shown in FIG. 11, so that a detailed description is omitted.

In the circuit of this embodiment, inductor L1 and capacitor C15 as well as inductor L2 and capacitor C16 which are designed to resonate in series in a desired frequency band are connected between RF input terminals 101, 102 and the half-wave double voltage rectifier circuit two-stage cascade connected circuit. For this reason, even if rectifier circuits are connected at multiple stages, amplitudes at nodes N5 and N6 can be increased in the desired frequency band.

Figure 14:
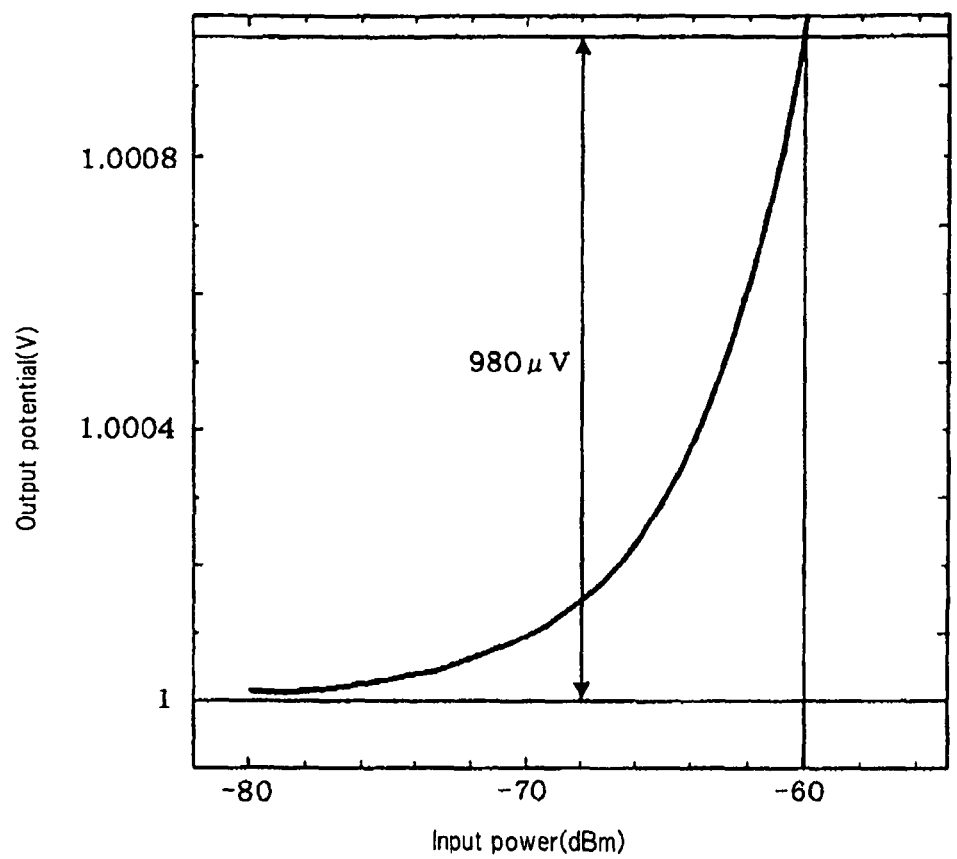
FIG. 14 is a graph showing the result of a characteristic simulation for the seventh embodiment of the present invention.

FIG. 14 is a graph, that by using a microwave simulator, shows the results of calculating the characteristics of a circuit comprising half-wave double voltage rectifier circuits that are connected in cascade at 20 stages by using n-type MOS transistors each having a threshold voltage of 0 V and a gate of 0.18 μm, when an RF signal in a 5.8 GHz band is applied thereto, as a specific example of the seventh embodiment of the present invention. In this event, the bias for the rectifier circuit was chosen to be 1 V. The horizontal axis represents input RF power, while the vertical axis represents the output potential of the rectifier circuit. By applying complementary RF signals to inputs of the respective rectifier circuits to improve the non-linear effect, and by further taking advantage of the resonance circuit to increase the input amplitudes, the rectification efficiency can be improved, and an amplitude of 980 μV, which is approximately 6 times as large can be generated as compared with a conventional case where transistors were connected at 100 stages.

Eighth Exemplary Embodiment

Figure 15:
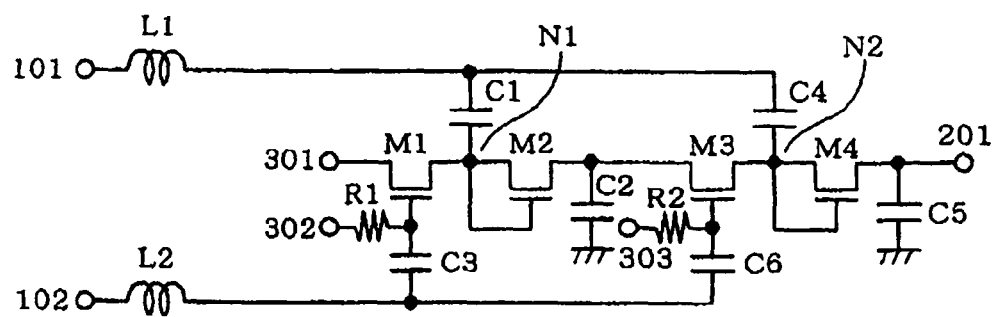
FIG. 15 is a circuit diagram of an eighth embodiment of the present invention.

FIG. 15 is a circuit diagram of a start signal detector circuit of an eighth exemplary embodiment of the present invention. The circuit of this embodiment comprises an inductor, which forms part of a series resonance circuit, added to an input section of the circuit of the sixth exemplary embodiment shown in FIG. 11. In this embodiment, the resonance circuits connected to the input terminals are comprised only of inductor L1 and an input capacitance of node N1, and inductor L2 and a gate input capacitance of MOS transistor M1, respectively. The circuit of this embodiment is employed when a desired frequency band is so high that capacitors C15 and C16, which have been used in the circuit of FIG. 13, are not needed.

Ninth Exemplary Embodiment

Figure 16:
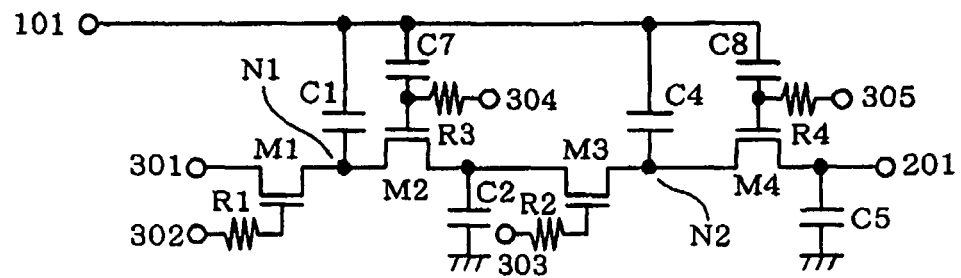
FIG. 16 is a circuit diagram of a ninth embodiment of the present invention.

FIG. 16 is a circuit diagram of a start signal detector circuit of a ninth exemplary embodiment of the present invention. In a half-wave double voltage rectifier circuit two-stage cascade connected circuit of this embodiment, gate terminals of MOS transistors M2, M4 are separated from respective source terminals thereof, connected to RF input terminal 101 through capacitors C7, C8, respectively, and connected to DC bias terminals 304, 305 through R3, R4. The remaining configuration is the same as the fifth exemplary embodiment shown in FIG. 10. Capacitors C7, C8 are intended to separate the gate terminals of MOS transistors M2, M4 from a DC bias of an input signal, and MOS transistors M2, M4 are applied with gate biases from DC bias terminals 304, 405 through R3, R4. The operation of this embodiment is similar to that of the fifth embodiment shown in FIG. 10.

Tenth Exemplary Embodiment

Figure 17:
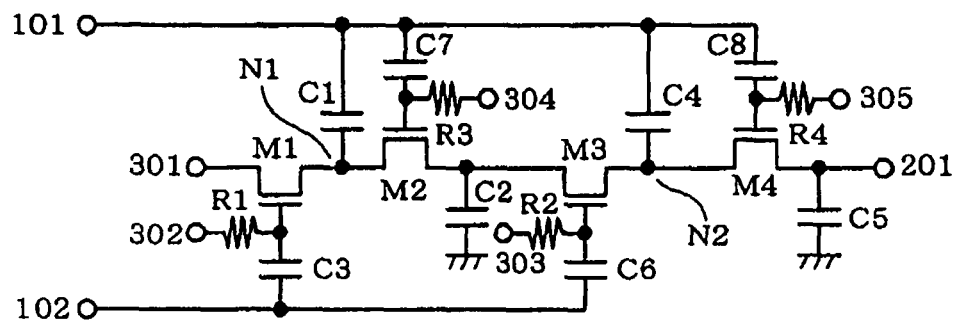
FIG. 17 is a circuit diagram of a tenth embodiment of the present invention.

FIG. 17 is a circuit diagram of a start signal detector circuit of a tenth exemplary embodiment of the present invention. In a half-wave double voltage rectifier circuit two-stage cascade connected circuit of this embodiment, gate terminals of MOS transistors M2, M4 are separated from respective source terminals thereof, connected to RF input terminal 101 through capacitors C7, C8, respectively, and connected to DC bias terminals 304, 305 through R3, R4. The remaining configuration is the same as the sixth exemplary embodiment shown in FIG. 11. Capacitors C7, C8 are intended to separate the gate terminals of MOS transistors M2, M4 from a DC bias of an input signal, and MOS transistors M2, M4 are applied with gate biases from DC bias terminals 304, 405 through R3, R4. The operation of this embodiment is similar to that of the sixth exemplary embodiment shown in FIG. 11.

Eleventh Exemplary Embodiment

Figure 18:
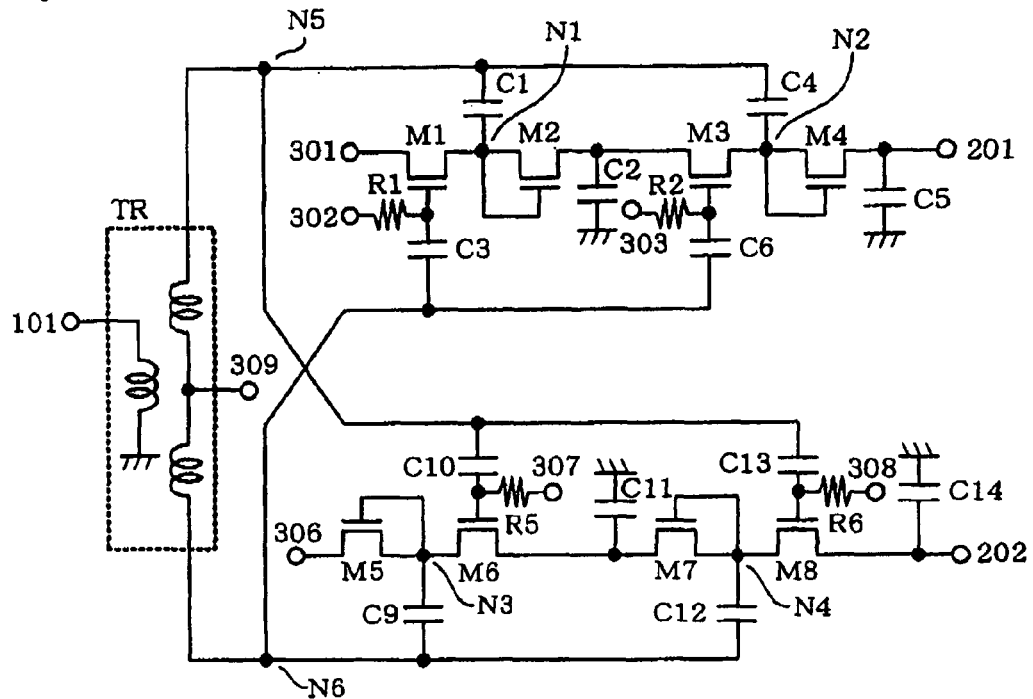
FIG. 18 is a circuit diagram of an eleventh embodiment of the present invention.

FIG. 18 is a circuit diagram of a start signal detector circuit of an exemplary eleventh embodiment of the present invention. A rectifier circuit of this embodiment is comprised of two half-wave double voltage rectifier circuits connected at two stages, and a transformer for transforming a single-phase signal to a double-phase signal.

In FIG. 18, 101 designates an RF input terminal; 201, 202 designate output terminals; 301-303, 306-308 designate DC bias terminals; M1-M8 designate MOS transistors; C1-C6, C9-C14 designate capacitors; R1, R2, R5, R6 designate resistors; TR designates a transformer; and 309 designates a DC bias terminal of the transformer. Transformer TR generates a double-phase signal, the phase of which inverts based on the potential at DC bias terminal 309. This signal is detected by two rectifier circuits.

A two-stage cascade connected half-wave double voltage rectifier circuit shown in an upper column of FIG. 18 is similar in configuration and operation to that of the sixth exemplary embodiment shown in FIG. 11, so that detailed descriptions thereon are omitted.

In a two-stage cascade connected half-wave double voltage rectifier circuit in a lower column of FIG. 18, MOS transistor M5 has a source terminal connected to DC bias terminal 306, and a gate terminal and a drain terminal commonly connected to node N3. Node N3 is connected to node N6 through capacitor C9, and is applied with an RF signal. MOS transistor M6 has a source terminal connected to node N3 and applied with an RF signal, and a gate connected to node N5 through capacitor C10, which is applied with an RF signal at a phase opposite to the source terminal. In this regard, capacitor C10 is intended to block a DC bias of the RF signal from the gate of MOS transistor M6, and a DC potential at the gate is supplied from DC bias terminal 307 through resistor R5.

When a positive half wave is applied to node N6, a current flows from node N6 to terminal 306 through MOS transistor M5 to charge capacitor C9. As a result, the potential at node N3 is reduced by a rectified voltage of the RF signal from the DC bias applied to terminal 306. In the next half period, since the drain-source voltage of MOS transistor M5 is reversely biased, no drain current flows into MOS transistor M5. Then, current flows from capacitor C9 through MOS transistor M6 to charge capacitor C11. In this event, since an amplitude twice as large as the RF signal is equivalently applied between the source-gate of MOS transistor M6, the drain current increases to increase a change in potential. Finally, the potential on capacitor C11 is reduced by the sum of charges charged in the respective half periods. Since this configuration can significantly enhance the non-linearity of the MOSFET even if the input amplitude is small, rectification efficiency can be improved as a result. Further, MOS transistors M7 and M8, capacitors C12-C14, and resistor R6 comprise a half-wave double voltage rectifier circuit similar to the former stage. Specifically, a potential at node N4 is reduced by twice the rectified voltage of the RF signal from the potential at node N3, and finally, the potential at output terminal 202 is reduced by the respective half-wave double voltage rectifier circuits at two stages from DC bias terminal 306.

Twelfth Exemplary Embodiment

Figure 19:
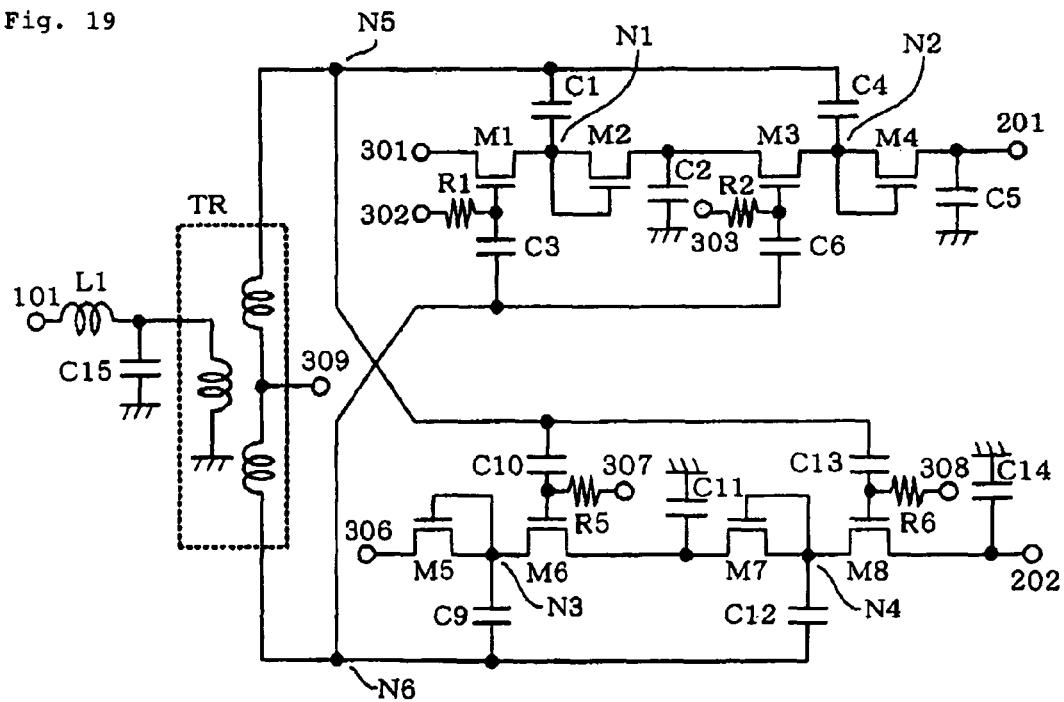
FIG. 19 is a circuit diagram of a twelfth embodiment of the present invention.

FIG. 19 is a circuit diagram of a start signal detector circuit of a twelfth exemplary embodiment of the present invention. A rectifier circuit of this embodiment is comprised of two half-wave double voltage rectifier circuits connected at two stages, a transformer for transforming a single-phase signal to a double-phase signal, and a resonance circuit. The circuit of this embodiment comprises inductor L1 and capacitor C15, which are designed to resonate in series in a desired frequency band that is connected to an transformer input section in the circuit of the eleventh exemplary embodiment shown in FIG. 18. Therefore, the operation is similar to the case of the aforementioned eleventh embodiment, but the resonance circuit connected to the signal input section can increase the amplitude of RF input and further improve the rectification efficiency.

In this regard, in the circuit shown in FIG. 19, capacitor C15 can be removed when a resonance circuit can only be comprised of inductor L1 and an input capacitance of transformer in a desired frequency band even if capacitor C15 is not used.

Figure 20:
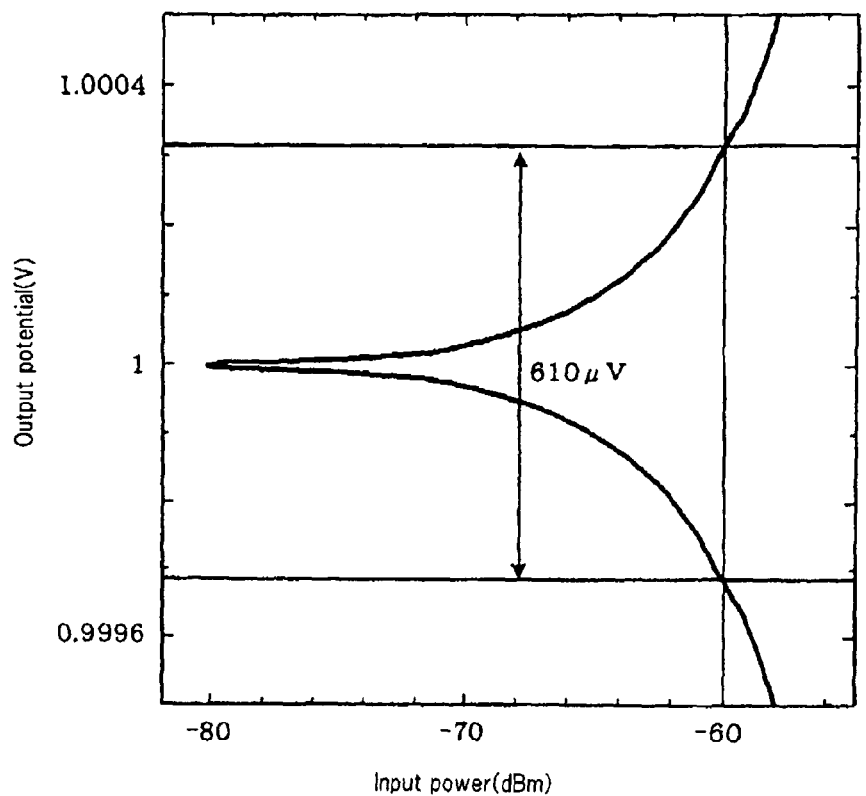
FIG. 20 is a graph showing the result of a characteristic simulation for the twelfth embodiment of the present invention.

FIG. 20 is a graph, that by using a microwave simulator, shows the result of calculating the characteristics of a circuit comprising two sets of half-wave double voltage rectifier circuits that are connected in cascade at 20 stages by using n-type MOS transistors each having a threshold voltage of 0 V and a gate of 0.18 µm, when an RF signal in a 5.8 GHz band is applied thereto, as a specific example of the twelfth exemplary embodiment of the present invention. In this event, the bias for the rectifier circuit was chosen to be 1 V. The horizontal axis represents input RF power, while the vertical axis represents an output potential of the rectifier circuit. Two characteristics are the characteristic of a rectifier circuit which exhibits a voltage increasing characteristic and the characteristic of a rectifier circuit which exhibits a voltage reducing characteristic, respectively. Since a signal can be determined by amplifying the voltage difference between these circuits, a rectified voltage is approximately 610 µV in this event. According to this embodiment, an amplitude approximately four times as large can be generated as compared with the conventional circuit which comprises transistors connected at 100 stages.

Thirteenth Exemplary Embodiment

Figure 21:
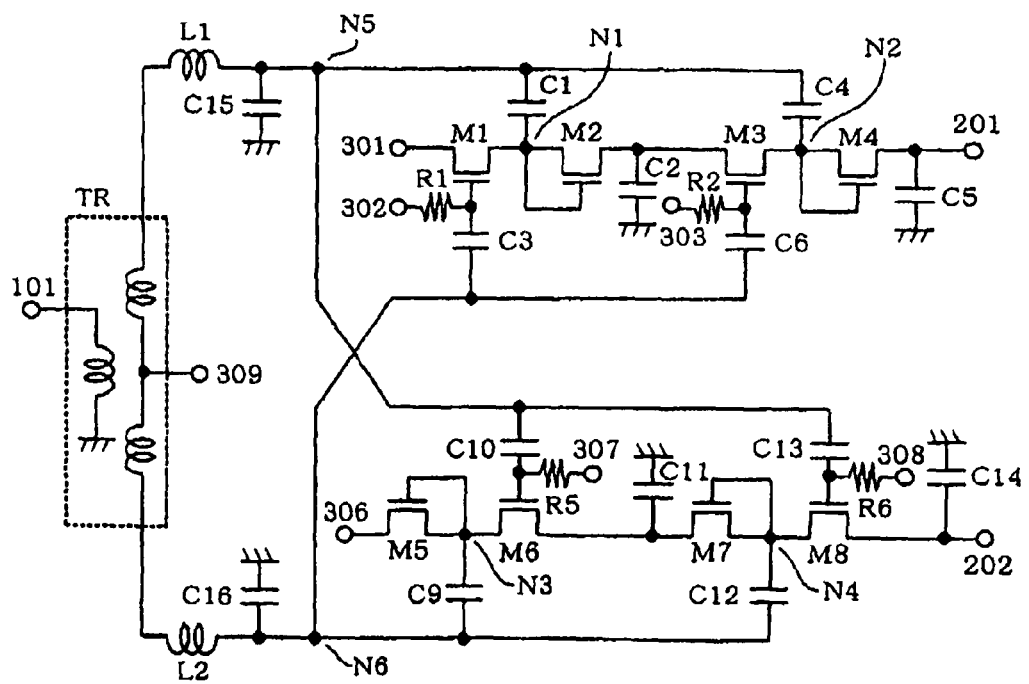
FIG. 21 is a circuit diagram of a thirteenth embodiment of the present invention.

FIG. 21 is a circuit diagram of a start signal detector circuit of a thirteenth exemplary embodiment of the present invention. A rectifier circuit of this embodiment is comprised of two half-wave double voltage rectifier circuit connected at two stages; a transformer for transforming a single-phase signal to a double-phase signal; and two resonance circuits. The circuit configuration except for the resonance circuits is the same as the eleventh exemplary embodiment shown in FIG. 18. The resonance circuits are comprised of inductor L1 and capacitor C15, and inductor L2 and capacitor C16, where inductors L1, L2 are designed to resonate in series with capacitors C15, C16, respectively, in a desired frequency band. For this reason, even if rectifier circuits are connected at multiple stages, amplitudes at nodes N5 and N6 can be increased in the desired frequency band.

Fourteenth Exemplary Embodiment

Figure 22:
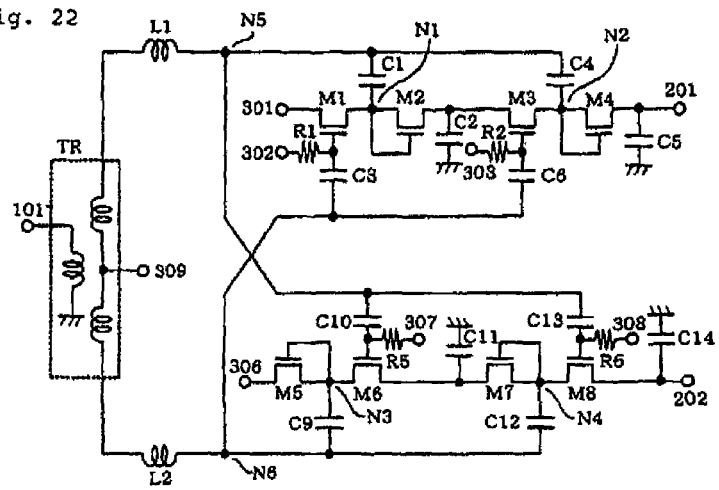
FIG. 22 is a circuit diagram of a fourteenth embodiment of the present invention.

FIG. 22 is a circuit diagram of a start signal detector circuit of a fourteenth exemplary embodiment of the present invention. A rectifier circuit of this embodiment is comprised of two half-wave double voltage rectifier circuit connected at two stages; a transformer for transforming a single-phase signal to a double-phase signal; and two resonance circuits. This embodiment differs from the circuit of the thirteenth exemplary embodiment shown in FIG. 21 in that resonance circuits connected to the output side of transformer TR are comprised only of inductors L1, L2 and an input capacitance of the rectifier circuit, respectively. The circuit of this embodiment is employed when a desired frequency band is so high that capacitors C15 and C16 are not needed.

Figure 23:
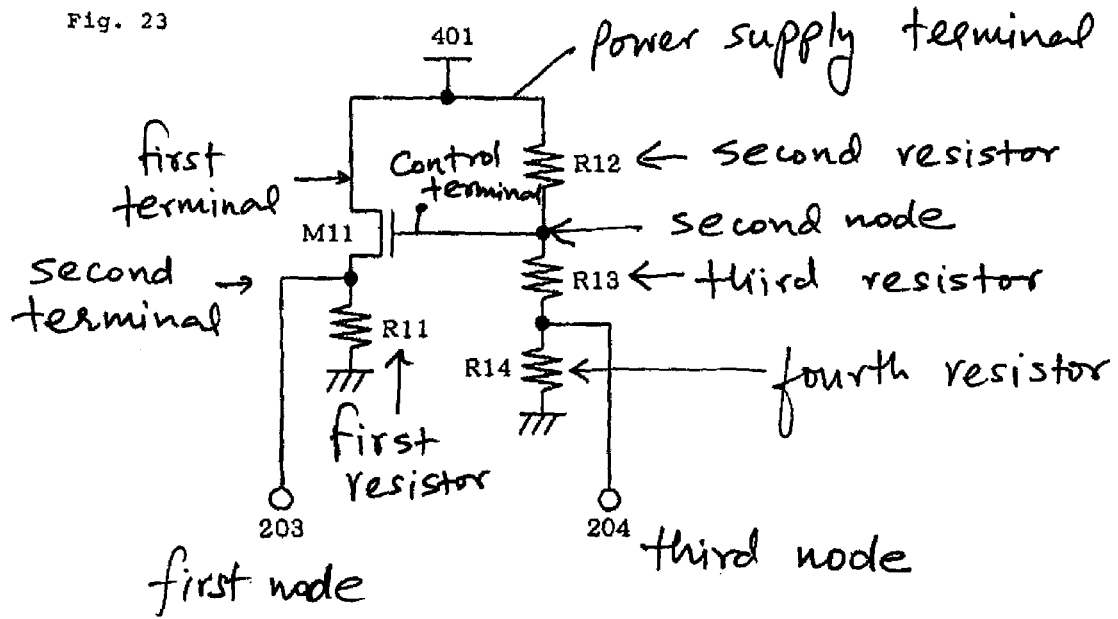
FIG. 23 is a circuit diagram showing an exemplary DC bias generator circuit for a start signal detector circuit of the present invention.

FIG. 23 is a circuit diagram showing an exemplary circuit for generating a DC bias for the start signal detector circuit of the present invention. In FIG. 23, 401 designates a power supply terminal; M11 designates a MOS transistor which is the same in size as a transistor used as a non-linear element in the circuits of embodiments of the present invention; R11-R14 designate resistors; and 203, 204 designate output terminals. In this circuit, the potential at power supply terminal 401 is divided by resistors R12, R13, R14, such that a gate of MOS transistor M11 and output terminal 204 are applied with a constant potential. Also, output terminal 203 outputs a potential which is lower than a gate potential of MOS transistor M11 by the amount of a threshold voltage of MOS transistor M11. By connecting the two output terminals to the DC bias of the detector circuit so far described, for example and by connecting output terminals 203, 204 to DC bias terminals 301, 302 in FIG. 6, respectively, it is possible to absorb fluctuations in the threshold voltage to realize a stable rectification efficiency.

Figure 24:
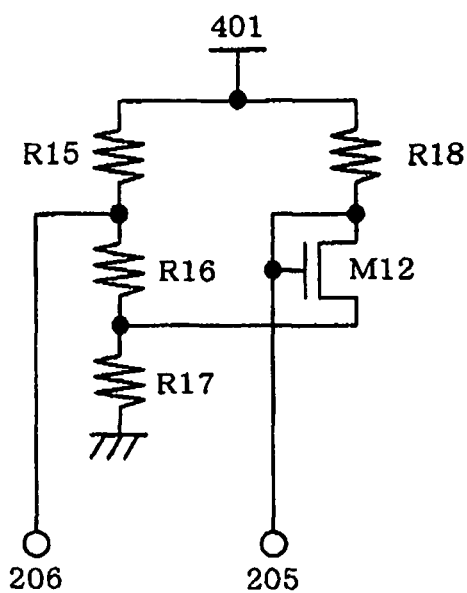
FIG. 24 is a circuit diagram showing another exemplary DC bias generator circuit for the start signal detector circuit of the present invention.

FIG. 24 is a diagram showing another exemplary circuit for generating a DC bias for the start signal detector of the present invention. In FIG. 24, 401 designates a power supply terminal; M12 designates a MOS transistor which is the same in size as a transistor used as a non-linear element in the circuits of embodiments of the present invention; R15-R18 designate resistors; and 205, 206 designate output terminals. In this circuit, the potential at power supply terminal 401 is divided by resistors R15, R16, R17, such that output terminal 206 and a connection node of resistors R16, R17 are applied with constant potentials. Then, output terminal 205 outputs a potential which is higher than the potential at the connection node of resistors R16, R17 by the amount of a threshold voltage of MOS transistor M12. By connecting the two output terminals to the DC bias of the detector circuit so far described, for example and by connecting output terminals 205, 206 to DC bias terminals 302, 301 in FIG. 6, respectively, it is possible to absorb fluctuations in the threshold voltage to realize a stable rectification efficiency.

In the embodiments of the present invention described above, half-wave rectifier circuits are connected at multiple stages, where each circuit hardly requires a bias current, and therefore consume low power. While each of the embodiments of the present invention has been described using a MOS transistor as an element having a non-linear resistance, any element having such a non-linear resistance characteristic, for example, a bipolar transistor, a junction-type field effect transistor and the like, can implement the present invention in principle.

The invention claimed is:

1. A start signal detector circuit comprising a three-terminal element including a first and a second terminal and a control terminal, a resistance value of which changes non-linearly in response to a control voltage or a control current applied to said control terminal, wherein a bias potential is applied to the first terminal and the control terminal of the three-terminal element, and an input signal is applied to the second terminal,
wherein any terminal of the first or second three-terminal element forming a part of said start signal detector circuit is supplied with potentials formed at a first and a third node of a bias potential generator circuit comprising a third three-terminal element including a first and a second terminal and a control terminal, the resistance value of which changes non-linearly in response to a control voltage or a control current applied to said control terminal, where the first terminal, the second terminal, and the control terminal are connected to the power supply terminal, the first node, and a second node, respectively, a first resistor is connected between the first node and a ground point, a second resistor is connected between the power supply terminal and the second node, a third resistor is connected between the second node and the third node, and a fourth resistor is connected between the third node and the ground point.

2. The start signal detector circuit according to claim 1, wherein a capacitor for accumulating a signal charge is connected to the second terminal of said second three-terminal element.

3. The start signal detector circuit according to claim 1, wherein any terminal of the first or second three-terminal element which forms part of said start signal detector circuit is supplied with potentials formed at a fourth and a sixth node of a bias potential generator circuit in which a fifth resistor is connected between the power supply terminal and the fourth node, a sixth resistor is connected between the fourth node and a fifth node, a seventh resistor is connected between the fifth node and the ground point, and a seventh resistor is connected between the power supply terminal and the sixth node, said bias potential generator circuit comprising a fourth three-terminal element having a first terminal, a second terminal and a control terminal, the resistance value of which non-linearly changes in response to a control voltage or a control current applied to said control terminal, where the first terminal and the control terminal are connected to the sixth node, and the second terminal is connected to the fifth node.

4. The start signal detector circuit according to claim 1, wherein said three-terminal element is a field effect transistor.

5. The start signal detector circuit according to claim 1, wherein said three-terminal element is a bipolar transistor.

6. A start signal detector circuit comprising a three-terminal element including a first and a second terminal and a control terminal, a resistance value of which changes non-linearly in response to a control voltage or a control current applied to said control terminal, wherein a bias potential is applied to the first terminal of the three-terminal element, an input signal is applied to the second terminal, and a signal at a phase opposite to the input signal is applied to the control terminal,
wherein any terminal of the first or second three-terminal element forming a part of said start signal detector circuit is supplied with potentials formed at a first and a third node of a bias potential generator circuit comprising a third three-terminal element including a first and a second terminal and a control terminal, the resistance value of which changes non-linearly in response to a control voltage or a control current applied to said control terminal, where the first terminal, the second terminal, and the control terminal are connected to the power supply terminal, the first node, and a second node, respectively, a first resistor is connected between the first node and a ground point, a second resistor is connected between the power supply terminal and the second node, a third resistor is connected between the second node and the third node, and a fourth resistor is connected between the third node and the ground point.

7. The start signal detector circuit according to claim 6, wherein a capacitor for accumulating a signal charge is connected to the second terminal of said second three-terminal element.

8. The start signal detector circuit according to claim 6, wherein a DC bias voltage is supplied to a node directly connected to the control terminal which is not connected to the first terminal or the second terminal.

9. The start signal detector circuit according to claim 6, wherein a transformer for converting a single-phase signal to a differential signal is used to generate the input signal and the signal at a phase opposite thereto, and these signals are applied to the input terminals.

10. The start signal detector circuit according to claim 6, further comprising an inductor which is connected between a terminal, to which an in-phase/opposite phase input signal is applied, and said control terminal, said in-phase/opposite phase input signal being supplied to said control terminal as the signal at the phase opposite to the input signal.

11. The start signal detector circuit according to claim 9, wherein an inductor is connected to an input terminal of said transformer.

12. The start signal detector circuit according to claim 10, further comprising a series resonance circuit, which resonates in a desired frequency band, wherein a part of said series resonance circuit is formed by said inductor and by a separately connected capacitor or a stray capacitor.

13. The start signal detector circuit according to claim 6, wherein any terminal of the first or second three-terminal element which forms part of said start signal detector circuit is supplied with potentials formed at a fourth and a sixth node of a bias potential generator circuit in which a fifth resistor is connected between the power supply terminal and the fourth node, a sixth resistor is connected between the fourth node and a fifth node, a seventh resistor is connected between the fifth node and the ground point, and a seventh resistor is connected between the power supply terminal and the sixth node, said bias potential generator circuit comprising a fourth three-terminal element having a first terminal, a second terminal and a control terminal, the resistance value of which non-linearly changes in response to a control voltage or a control current applied to said control terminal, where the first terminal and the control terminal are connected to the sixth node, and the second terminal is connected to the fifth node.

14. The start signal detector circuit according to claim 6, wherein said three-terminal element is a field effect transistor.

15. The start signal detector circuit according to claim 6, wherein said three-terminal element is a bipolar transistor.

16. A start signal detector circuit comprising a three-terminal element and a capacitance, said three-terminal element including a first terminal, a second terminal and a control terminal, the resistance value of which changes non-linearly in response to a control voltage or a control current applied to said control terminal, wherein a bias potential is applied to the first terminal and the control terminal of said three-terminal element, and an input signal is applied to the second terminal,
wherein any terminal of the first or second three-terminal element forming a part of said start signal detector circuit is supplied with potentials formed at a first and a third node of a bias potential generator circuit comprising a third three-terminal element including a first and a second terminal and a control terminal, the resistance value of which changes non-linearly in response to a control voltage or a control current applied to said control terminal, where the first terminal, the second terminal, and the control terminal are connected to the power supply terminal, the first node, and a second node, respectively, a first resistor is connected between the first node and a ground point, a second resistor is connected between the power supply terminal and the second node, a third resistor is connected between the second node and the third node, and a fourth resistor is connected between the third node and the ground point.

\* \* \* \* \*